(12) United States Patent
Aguera y Arcas et al.

(10) Patent No.: US 7,912,299 B2
(45) Date of Patent: Mar. 22, 2011

(54) SYSTEM AND METHOD FOR EFFICIENTLY ENCODING DATA

(75) Inventors: Blaise Aguera y Arcas, Seattle, WA (US); Julian Walker, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 1042 days.

(21) Appl. No.: 11/247,513

(22) Filed: Oct. 11, 2005

(65) Prior Publication Data

US 2008/0031527 A1 Feb. 7, 2008

Related U.S. Application Data

(63) Continuation-in-part of application No. 11/082,556, filed on Mar. 17, 2005, now Pat. No. 7,254,271.

(60) Provisional application No. 60/622,867, filed on Oct. 28, 2004, provisional application No. 60/617,485, filed on Oct. 8, 2004.

(51) Int. Cl.
*G06K 9/36* (2006.01)
(52) U.S. Cl. .................................. 382/232; 375/E7.198
(58) Field of Classification Search .................. 382/232; 375/E7.198
See application file for complete search history.

(56) References Cited

U.S. PATENT DOCUMENTS

| 4,532,605 | A | 7/1985 | Waller |
| 4,549,275 | A | 10/1985 | Sukonick |
| 4,597,057 | A * | 6/1986 | Snow .............................. 341/60 |
| 4,847,788 | A | 7/1989 | Shimada |
| 5,222,205 | A | 6/1993 | Larson |
| 5,237,647 | A | 8/1993 | Roberts et al. |
| 5,367,615 | A | 11/1994 | Economy et al. |
| 5,471,572 | A | 11/1995 | Buchner |
| 5,590,250 | A | 12/1996 | Lamping |
| 5,666,475 | A | 9/1997 | Salesin |
| 5,699,497 | A | 12/1997 | Erdahl |
| 5,760,783 | A | 6/1998 | Migdal et al. |
| 5,999,187 | A | 12/1999 | Dehmlow |
| 6,002,406 | A | 12/1999 | Zhao |
| 6,034,661 | A | 3/2000 | Servan-Scheiber |
| 6,154,213 | A | 11/2000 | Rennison |
| 6,184,894 | B1 | 2/2001 | Rosman |
| 6,191,793 | B1 | 2/2001 | Piazza et al. |
| 6,204,850 | B1 | 3/2001 | Green |
| 6,204,857 | B1 | 3/2001 | Piazza |
| 6,259,458 | B1 | 7/2001 | Theisen et al. |
| 6,313,837 | B1 | 11/2001 | Assa et al. |
| 6,324,621 | B2 | 11/2001 | Singh et al. |
| 6,348,921 | B1 | 2/2002 | Zhao |
| 6,356,659 | B1 | 3/2002 | Wiskott |
| 6,360,029 | B1 | 3/2002 | Moller |
| 6,373,495 | B1 | 4/2002 | Lin |

(Continued)

OTHER PUBLICATIONS

International Search Report and Written Opinion in PCT/US/2006/011405.

(Continued)

*Primary Examiner* — Bhavesh M Mehta
*Assistant Examiner* — Stephen R Koziol
(74) *Attorney, Agent, or Firm* — Shook, Hardy & Bacon LLP

(57) ABSTRACT

A system and method are disclosed which may include converting data identifying a plurality of visual features into a plurality of pixel characteristic data values; and forming an image file with pixels having the respective pixel characteristic data values.

26 Claims, 4 Drawing Sheets

U.S. PATENT DOCUMENTS

| | | | |
|---|---|---|---|
| 6,392,661 B1 | 5/2002 | Tankersley | |
| 6,400,372 B1 | 6/2002 | Gossweiler, III | |
| 6,424,933 B1 | 7/2002 | Agrawala et al. | |
| 6,453,330 B1 | 9/2002 | Battle | |
| 6,476,829 B1 | 11/2002 | Smith | |
| 6,493,858 B2 | 12/2002 | Solomon | |
| 6,501,482 B1 | 12/2002 | Rosman | |
| 6,505,205 B1 | 1/2003 | Kothuri et al. | |
| 6,509,892 B1 | 1/2003 | Cooper et al. | |
| 6,563,517 B1 | 5/2003 | Bhagwat et al. | |
| 6,639,598 B2 | 10/2003 | Piazza | |
| 6,650,326 B1 | 11/2003 | Huber | |
| 6,681,056 B1 | 1/2004 | Tseng et al. | |
| 6,703,924 B2* | 3/2004 | Tecu et al. | 340/407.1 |
| 6,708,309 B1* | 3/2004 | Blumberg | 715/209 |
| 6,747,649 B1 | 6/2004 | Sanz-Pastor | |
| 6,763,137 B1 | 7/2004 | Krtolica | |
| 6,763,139 B1 | 7/2004 | Andrew | |
| 6,885,939 B2 | 4/2005 | Schmidt et al. | |
| 6,891,535 B2 | 5/2005 | Perry et al. | |
| 6,904,423 B1 | 6/2005 | Nicolaou et al. | |
| 6,907,345 B2 | 6/2005 | Shipley | |
| 6,909,965 B1 | 6/2005 | Beesley | |
| 6,912,462 B2 | 6/2005 | Ogaki | |
| 6,927,782 B2 | 8/2005 | Coldefy | |
| 6,943,811 B2 | 9/2005 | Matthews | |
| 6,961,754 B2 | 11/2005 | Christopoulos et al. | |
| 6,981,119 B1 | 12/2005 | Lepak et al. | |
| 6,982,726 B1 | 1/2006 | Berestov | |
| 6,985,929 B1 | 1/2006 | Wilson et al. | |
| 6,993,476 B1 | 1/2006 | Dutta et al. | |
| 7,072,764 B2 | 7/2006 | Donath | |
| 7,075,535 B2* | 7/2006 | Aguera y Arcas | 345/428 |
| 7,088,866 B2 | 8/2006 | Andrew | |
| 7,096,118 B2 | 8/2006 | Cochlovius et al. | |
| 7,107,285 B2 | 9/2006 | von Kaenel et al. | |
| 7,181,457 B2 | 2/2007 | Reinauer et al. | |
| 7,206,696 B2 | 4/2007 | Furukawa | |
| 7,248,262 B2 | 7/2007 | Cao | |
| 7,283,135 B1 | 10/2007 | Cote et al. | |
| 7,346,856 B2 | 3/2008 | Nguyen et al. | |
| 7,365,655 B2* | 4/2008 | Rao et al. | 341/50 |
| 7,428,004 B2* | 9/2008 | Creamer et al. | 348/211.3 |
| 7,430,473 B2 | 9/2008 | Foo et al. | |
| 7,480,333 B2* | 1/2009 | Rault | 375/240.12 |
| 7,542,882 B2 | 6/2009 | Agrawala et al. | |
| 7,600,183 B2* | 10/2009 | Stern et al. | 715/243 |
| 2001/0030647 A1 | 10/2001 | Sowizral | |
| 2002/0075311 A1 | 6/2002 | Orbanes et al. | |
| 2002/0116586 A1 | 8/2002 | Tremblay et al. | |
| 2003/0026268 A1 | 2/2003 | Navas | |
| 2003/0135649 A1 | 7/2003 | Buckley et al. | |
| 2004/0027258 A1 | 2/2004 | Pechatnikov et al. | |
| 2004/0056861 A1 | 3/2004 | Huber et al. | |
| 2004/0095400 A1 | 5/2004 | Anderson et al. | |
| 2004/0128070 A1 | 7/2004 | Schmidt et al. | |
| 2004/0130579 A1 | 7/2004 | Ishii et al. | |
| 2004/0145679 A1 | 7/2004 | Kim | |
| 2004/0170332 A1 | 9/2004 | Andrew | |
| 2004/0187124 A1 | 9/2004 | Labelle | |
| 2005/0041858 A1 | 2/2005 | Celi et al. | |
| 2005/0149979 A1 | 7/2005 | Creamer et al. | |
| 2006/0023956 A1* | 2/2006 | Hugosson et al. | 382/232 |
| 2008/0025391 A1* | 1/2008 | Amon et al. | 375/240.02 |
| 2009/0016433 A1* | 1/2009 | Henocq et al. | 375/240.01 |

OTHER PUBLICATIONS

Chi, Chi-Hung, et al. "Pervasive Web Content Delivery with Efficient Data Reuse" Jul. 26, 2004, [online] [retrieved on Jun. 15, 2007] Retrieved from the Internet <URL:http://web.archive.org/web/20040726072942/http://2002.iwcw.org/papers/18500120.pdf> entire document (especially p. 8, col. 1, p. 9, col. 2, p. 11, col. 1, p. 13).

Williams, Lance, "Pyramidal Parametrics", Jul. 1983, pp. 1-11, ACM SIGGRAPH Computer Graphics, Computer Graphics Laboratory, New York Institute of Technology, Old Westbury, New York, vol. 17, Issue 3.

Bill Overall, Foveated Image: Applications to Image and Video Compress, Mar. 12, 1999, http://scien.standord, edu/class/psych221/projects/99/wro.

Foley et al., Computer Graphics: Principles and Practice, Addison-Wesley Publishing Company Inc:, 1997, p. 166-170.

Hierarchical Data Structures, CS488/688: Introduction to Interactive Computer Graphics, University of Waterloo, Feb. 18, 2001, http://web.archive.org/web/2001028051725/http://medialab.di.unipi.it/web/IUM/Waterloo/node73. html.

How to Read a United States National Grid (USNG) Spatial Address, 2000, http:/www.xyproject.org/How%20Read% 20USNG/How%20to%20read%20USNG.htm.

Mix-in class for Parent Figures, May 10, 2000. http://web.archive.org/web/20030510164335/http://openhealth.com/bw/doc/auto/Parent.html.

Reading Topographic Maps, Feb. 14, 2003, http://web.archive.org/web/20030214004603/http://www.map-reading.com/ch4-3,php.

Space Variant Imaging, Nov. 25, 2002, http://web.archive/org/web/20021125075827/http://;www.svi.cps.utexas.edu/index.htm.

TDB-ACC-NO: NN961137—Disclosure Title: Multidimensional Index Structure With Multi-Level Entry and Skip-Level Search for Partially-Specified Queries.—Publication-Data: IBM Technical Disclosure Bulletin, Nov. 1996, US.

The Annoteated VRML 97 Reference, 1999, http://assad.osu.edu/~pgerstma/class/vnv/resources/info/AnnotatedVrmlRef/ch1.htm.

* cited by examiner

FIG. 3

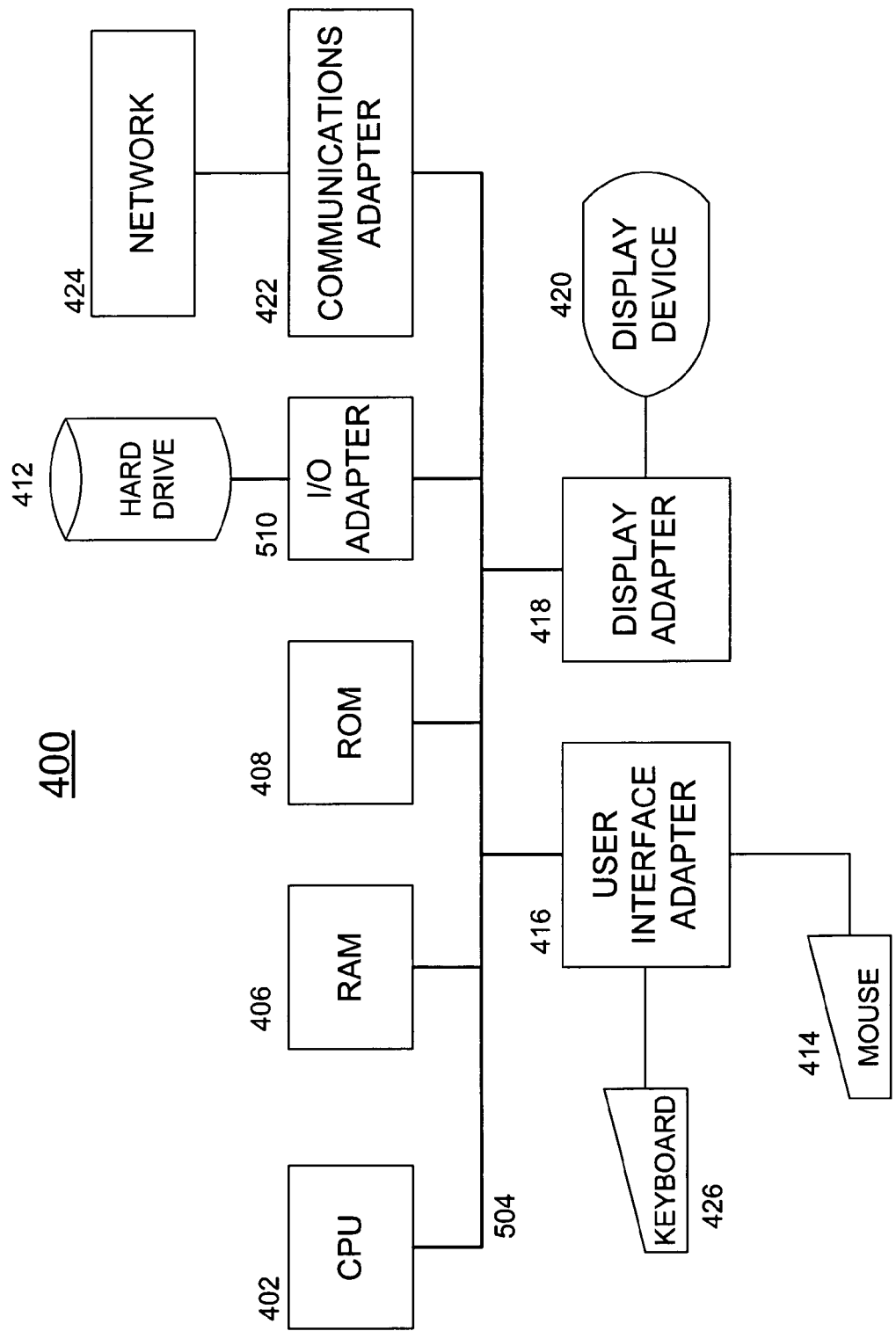

SYSTEM AND METHOD FOR EFFICIENTLY ENCODING DATA

CROSS-REFERENCE TO RELATED APPLICATIONS

This application claims the benefit of U.S. Provisional Patent Application Ser. No. 60/617,485, filed Oct. 8, 2004, entitled "Method for Encoding Large Texts, Metadata, and other Coherently Accessed Non-Image Data" which is incorporated herein by reference; this application is also a continuation in part of U.S. patent application Ser. No. 11/082,556, filed Mar. 17, 2005, now U.S. Pat. No. 7,254,271 entitled "Method for Encoding and Serving Geospatial or Other Vector Data as Images" which claims the benefit of U.S. Provisional Patent Application Ser. No. 60/622,867, filed Oct. 28, 2004, entitled "Method for Encoding and Serving Geospatial or Other Vector Data as Images," all of which applications are hereby incorporated herein by reference.

BACKGROUND OF THE INVENTION

Recently, image compression standards such as JPEG2000/JPIP (JPEG 2000 Interactive Protocol) have been introduced to meet a demanding engineering goal: to enable very large images (i.e. gigapixels in size) to be delivered incrementally or selectively from a server to a client over a low-bandwidth communication channel. (See David Taubman's implementation of Kakadu at www.kakadusoftware.com). When such images are being viewed at full resolution, only a limited region of each image can fit on a client's graphical display at any given time. The new standards are geared toward selectively accessing such regions and sending across the communication channel only data relevant to the region. If this "region of interest" or ROI changes continuously, then a continuous dialogue between a client and server over a low-bandwidth channel can continue to keep the client's representation of the area inside the ROI accurate.

However, existing approaches generally require the transmission of substantial amounts of data to significantly shift the location of the region of interest, thus limiting the speed at which such shifts may be implemented. Moreover, existing approaches generally depend on sequential access to a linear string of text, thereby imposing a significant burden on text navigation when a client seeks to significantly change the location of the region of interest. Accordingly, an improved method for transmitting data from a server to a client is needed.

SUMMARY OF THE INVENTION

According to one or more embodiments, the invention provides a method that may include converting data identifying a plurality of visual features into a plurality of pixel characteristic data values; and forming an image file with pixels having the respective pixel characteristic data values. Preferably, the plurality of visual features comprise at least one graphical symbol. Preferably, the visual feature identification data comprises ASCII codes. Preferably, the visual feature identification data comprises frequency-order positions of the visual features. Preferably, the visual feature identification data is determined based on a combination of a) a frequency of use of the visual features and b) transition probabilities between successive ones of the visual features. Preferably, the pixel characteristic data values comprise at least one data type selected from the group consisting of: pixel intensity data values, pixel color data values, and image contrast data values.

Preferably, the pixel characteristic data values comprise pixel color data values. Preferably, the pixel color data values comprise at least one color-data value type selected from the group consisting of: RBG (Red, Blue, Green) pixel color data values, HSV (Hue Saturation Value) pixel color data values, and CMYK (Cyan, Magenta, Yellow, Black) color data values.

Preferably, the method further comprises losslessly compressing said image file. Preferably, the visual feature identification data comprises differences in values of the identification data for successive ones of the visual features. Preferably, the visual features comprise alphanumeric characters. Preferably, the method further comprises locating the pixels in said image file in a same order that said alphanumeric characters are ordered in, within an original document. Preferably, the method further comprises transmitting the image file to a client. Preferably, the method further comprises decoding at least a region of said image file into the alphanumeric characters for viewing by the client. Preferably, the method further comprises enabling the client to browse the decoded image file region in a first dimension.

Preferably, the method further comprises enabling the client to browse the decoded image file region in first and second dimensions. Preferably, browsing in said first dimension includes advancing along a line of the alphanumeric characters, and browsing in the second dimension preferably includes scrolling over a plurality of lines of the alphanumeric characters. Preferably, the browsing comprises browsing the decoded image file in a manner that emulates browsing within the original document. Preferably, the method further comprises correlating locations of the pixels in the image file with locations of the alphanumeric characters corresponding to said pixels in an original document containing the alphanumeric characters.

Preferably, the pixels' locations within the image file at least substantially correspond to locations of the corresponding alphanumeric characters in the original document. Preferably, the pixels' locations within the image file are substantially the same as locations of the corresponding alphanumeric characters in the original document. Preferably, the method further comprises transmitting at least a region of the image file from a server to a client. Preferably, the method further comprises requesting a region of the image file from a server by a client.

Preferably, the method further comprises sending the requested region of the image file by the server. Preferably, the sending step comprises transmitting compressed data suitable for decoding by the client.

According to another aspect, one or more embodiments of the present invention provide an apparatus that may include a processor operating under the instructions of a software program, the software program causing the apparatus to perform actions, including converting data identifying a plurality of visual features into a plurality of pixel characteristic data values; and forming an image file with pixels having the respective pixel characteristic data values.

According to another aspect, one or more embodiments of the present invention may provide a storage medium containing a software program operable to cause an apparatus including a processor under the instructions of the software program to perform actions, comprising: converting data identifying a plurality of visual features into a plurality of pixel characteristic data values; and forming an image file with pixels having the respective pixel characteristic data values.

Other aspects, features, advantages, etc. will become apparent to one skilled in the art when the description of the preferred embodiments of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 3 is a text image of the first five chapters of Ulysses encoded using frequency-order encoding in accordance with one or more embodiments of the present invention; and FIG. 4 is a block diagram of a computing system that may be adaptable for use with one or more embodiments of the present invention.

DETAILED DESCRIPTION OF THE PREFERRED EMBODIMENTS

One or more embodiments of the present invention may involve extending selectively decompressable image compression and transmission technologies to textual or other data that may be identified using a binary representation.

Herein, binary data that identify and/or describe visual features may be converted from an initial format, such as ASCII (American Standard Code for Information Interchange) or other format, may be converted into a format suitable for incorporation into image data, such as but not limited to pixel intensity data.

The visual features referred to above may include but are not limited to graphical symbols and/or alphanumeric characters. However, herein, visual features may include any visible image features that may be described and/or identified using binary data. Moreover, while such data may be encoded into pixel intensity data, the present invention is not limited to encoding in this format.

In one or more embodiments, the initial data (visual feature identification data) may be converted into several possible types of pixel characteristic data including but not limited to pixel intensity data, pixel color data, image contrast data, and/or other form of image data. The above-mentioned pixel color data may include but is not limited to Red, Blue, Green (RBG) pixel color data, Hue Saturation Value (HSV) pixel color data, Cyan, Magenta, Yellow, Black (CMYK) pixel color data, and/or other form of pixel color data.

Figure 1:
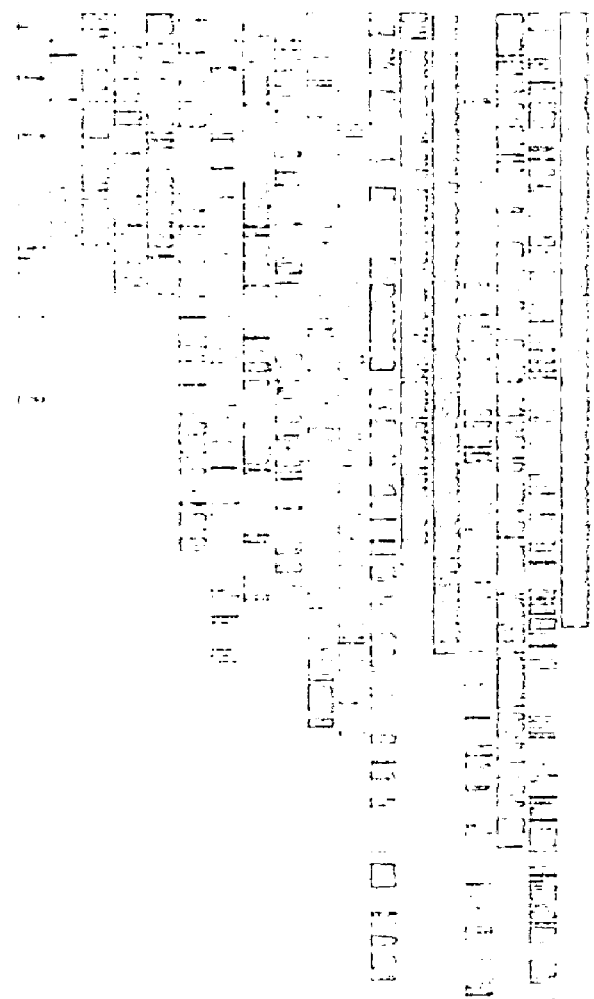
FIG. 1 is a text image of the full text of "Ulysses," using raw ASCII encoding in accordance with one or more embodiments of the present invention, with the color White having a numerical value of 0 and the color Black having a numerical value of 255.
Figure 2:
FIG. 2 is a text image of the first five chapters of Ulysses, encoded using raw ASCII in accordance with one or more embodiments of the present invention.

In the following discussion, a large text, specifically the book "Ulysses," by James Joyce, is considered. In one or more embodiments, this text may be formatted by putting each chapter in its own column, with columns for successive chapters arranged from left to right. However, it will be appreciated that other arrangements of the chapters may be implemented. Columns are assumed to have a maximum width in characters, such as 100. FIG. 1 shows the entire text of Ulysses encoded as an image in this fashion, with each pixel within FIG. 1 corresponding to a single text character (or character position that doesn't include text, such as empty space) in the original text document. FIG. 2 shows a text image of the first five chapters of Ulysses, using the same encoding method as in FIG. 1.

In one or more embodiments, the intensity value of each pixel may be set equal to the ASCII code of the character being encoded in the pixel. Because grayscale pixels and ASCII characters may both be represented using 8-bit sequences, (which may both have values in the range 0-255), the correspondence between a pixel value and a character may be readily implemented. In this disclosure, although textual and other characters may be represented with pixels using the ASCII code as a value for pixel intensity, it will be appreciated that other codes for textual or other characters may be employed for this purpose.

Generally, the full text of Ulysses in ordinary ASCII representation (i.e. as a standard text file) occupies 1.5 MB of storage space, which may be too large to transmit in its entirety over a narrowband communication channel. The pixel-characteristic-data representation of character data (which is known herein as the "character-pixel image" and also as the "text-image") of FIG. 1, encoded as a lossless JPEG2000 image, requires about 2.2 MB (Megabytes) of data storage space. This storage space requirement could be significantly reduced if the chapters of the book were more equal in length, resulting in less empty space (encoded as zeros) in the character-pixel image (text-image).

However, more important than the overall file size, is the ability of an ordinary JPIP server to serve this file to a client selectively and incrementally. Specifically, of concern here is the ability of a server to serve selected portions of the file at controllable increments of resolution.

In one or more embodiments, a client viewing the text at a zoom level sufficient to read the characters (which may require well over 1 pixel/character on the client-side display) can use JPIP (or other suitable protocol) to request only the relevant portion of the text. This operation is efficient, and adequate performance could be achieved for a reader of the text even with a very low bandwidth connection to the server, under conditions that would make it prohibitive to download the entire text, due to the magnitude of data involved in such a download.

In one or more embodiments, similar effects may be achieved using a client/server technology specifically designed for selective access to large texts, but the character-pixel image approach described above has a number of advantages over conventional implementations, which are listed below.

1) The character-pixel image approach may use existing technology and protocols designed for very large data volume.
2) The character-pixel image approach may easily scale up to texts of many gigabytes in size, or even larger, without any degradation of performance.
3) Access to text or other visual features within a region of interest is preferably two-dimensional in one or more embodiments of the present invention. Thus, in many situations (for example, when text is to be viewed in columns as in the Ulysses case), the character-pixel image approach disclosed herein preferably enables more efficient browsing than is available using existing approaches that deal with text as a one-dimensional string.
4) Because wavelets are used in JPEG2000, the character-pixel image is preferably subject to a multi-resolution representation. Although the text, or other visual feature identified using visual feature identification data, will generally not be readable at other than the final (most detailed) resolution, the broader spatial support of lower-resolution wavelets preferably provides an intelligent client-side cache for text, and/or other visual features, near the region of interest. Moving the ROI over various regions of the original text, as may be done when scrolling through text in a traditional manner, may therefore be efficiently performed using one or more embodiments of the present invention.

In one or more embodiments, the above concepts may be readily extended to deal with formatted text, Unicode, or other metadata, as all such data can be represented using ASCII text strings, possibly with embedded escape sequences.

In selected applications, JPEG2000 may be used as a lossy compression format, meaning that the decoded image bytes are not necessarily identical to the original bytes. Herein, the term "decoding" refers to converting pixel data in a text image back into the original text data, or other visual feature data. If the image bytes represent text, lossy compression will generally not be acceptable. One of the design goals of JPEG2000 was, however, to support lossless compression efficiently, as this is important for certain imaging functions (such as for medical and scientific applications). Lossless compression ratios for photographic images are typically only around 2:1, as compared with visually acceptable lossy images, which can usually easily be compressed by 24:1.

Image compression, both lossy and lossless, generally operate best on images that have good spatial continuity, meaning that the differences between the intensity values of adjacent pixels are low. The raw ASCII encoding is not optimal from this perspective, since successive text characters encoded in ASCII may have widely varying values. Thus, some alternatives are considered below.

FIG. 3 is a text image of the first five chapters of Ulysses encoded using frequency-order encoding in accordance with one or more embodiments of the present invention.

Frequency Encoding

In one or more embodiments of the present invention, the encoding efficiency may be improved by reordering characters according to their frequency of occurrence in the pertinent text, in the English language as a whole, or in another language as a whole, from highest frequency to lowest frequency. Thus, in one or more embodiments, empty space would have code zero, and a pixel value of zero in the character-pixel image. The "space" character could receive code "one" (with its corresponding value in the character-pixel image also being "1"). A sequence of characters such as e, t, a, o, i, n, s, r, h, l, etc. . . . could be caused to convert to successive pixel values starting with "2" (corresponding to "e") and proceeding upward therefrom up to the value 255.

It is possible that, upon converting all the characters in a large text into pixel values using this approach, all 255 pixel values could end up being used. However, by the very nature of the text character (or other visual feature) to pixel value conversion contemplated herein, pixel value occurrences preferably become increasingly rare with increasing numerical values thereof.

The image of FIG. 3 illustrates this point. Pixel values tend to cluster near zero. At least as importantly, the difference in pixel values between successive character-pixel values in the embodiment of FIG. 3 is preferably lower than in the embodiment of FIG. 2.

Where all pixel values in the range 0-255 are equally likely, eight bits will generally be needed to represent each pixel value. However, in embodiments in which some pixel values occur much more frequently than others, the pixel values can preferably be represented with fewer bits, without losing any information.

An example is considered to illustrate this point. In this extreme case, the pixel value equals zero 99% of the time, and has another value, somewhere between 0 and 255, the rest of the time. In this case, the encoding algorithm may encode the 0 value with a single "0" bit, and non-zero values with a leading "1" bit (to signal the presence of a non-zero value) followed by an 8-bit representation of the non-zero value. Thus, this approach conserves 7 bits per pixel for 99 out of 100 pixels, but uses one extra pixel to represent a non-zero pixel which occurs only 1% of the time. The decoding algorithm corresponding to the above-described encoding algorithm thus preferably interprets a "0" bit as representing a 0 bit value and a bit sequence starting with a "1" bit value has having the value represented by the bits succeeding the leading "1" bit.

However, even in less extreme situations, the existence of pixel values that occur much more frequently than others may enable considerable savings in storage space, without incurring any loss of pixel data, and by logical extension without incurring any loss of the visual-feature data represented by the pixel data. In general, two or more categories of value occurrence frequency may be established, generally using a progressively increasing number of bits to represent values occurring with decreasing frequency. In this manner, smaller bit sequences may be used most of the time, thereby conserving data storage space and data communication bandwidth requirements.

In an intermediate example, five bits could be used to represent the most frequently occurring pixel values, and nine bits for the less frequently occurring values. For the most frequently occurring visual features, a leading bit, which may be a "0", may be provided, which may be followed by four bits representing the actual value of the pixel. For the less frequency occurring pixel values, a leading bit, which may be a "1", may be provided, which may be followed by eight bits representing the actual value of the pixel.

In one or more other embodiments, frequency encoding may benefit from spatial coherence to represent a text image using a reduced number of bits. Specifically, the image may be divided into 8×8 pixel blocks, thus providing 64 pixels in each block, with each pixel representing a frequency encoded visual feature (which may be a text character). The encoding method may then review each block and determine the number of bits needed to represent the highest-valued pixel value in the block. This determined number of bits may then be used to represent all pixel values in that block.

For many of the blocks within any given image, the highest-value pixel may be able to be represented with four or fewer bits. Thus, considerable savings in data storage requirements may be obtained when employing this block by block approach.

In one or more embodiments, when the frequency-encoded text-image of Ulysses is compressed losslessly as a JPEG2000 image, the file size is 1.6 MB, barely larger than the raw ASCII text file (1.5 MB), and 37% smaller than the ASCII encoded text-image. With further optimizations of the letter encoding, the compressed file size can drop well below the ASCII text file size. The further optimizations can include, but are not limited to: using letter transition probabilities (Markov-1) to develop the encoding, instead of just frequencies (Markov-0); and/or encoding as pixels the delta or difference between one character and the next, rather than the characters themselves.

With these added optimizations, text ready to be served in this fashion may actually take up less data storage space than the raw ASCII.

One or more embodiments of the present invention discussed herein include using JPEG2000/JPIP as a selective image decompression technology, but the present invention is not limited to using this image compression technology. Other image compression formats and protocols may be employed in conjunction with the present invention, including but not limited to, for example, LizardTech's MrSID format and protocol, which has similar properties.

FIG. 4 is a block diagram of a computing system 400 adaptable for use with one or more embodiments of the present invention. In one or more embodiments, central processing unit (CPU) 402 may be coupled to bus 404. In addition, bus 404 may be coupled to random access memory (RAM) 406, read only memory (ROM) 408, input/output (I/O) adapter 410, communications adapter 422, user interface adapter 406, and display adapter 418.

In one or more embodiments, RAM 406 and/or ROM 408 may hold user data, system data, and/or programs. I/O adapter 410 may connect storage devices, such as hard drive 412, a CD-ROM (not shown), or other mass storage device to computing system 400. Communications adapter 422 may couple computing system 400 to a local, wide-area, or Internet network 424. User interface adapter 416 may couple user input devices, such as keyboard 426 and/or pointing device 414, to computing system 400. Moreover, display adapter 418 may be driven by CPU 402 to control the display on display device 420. CPU 402 may be any general purpose CPU.

It is noted that the methods and apparatus described thus far and/or described later in this document may be achieved utilizing any of the known technologies, such as standard digital circuitry, analog circuitry, any of the known processors that are operable to execute software and/or firmware programs, programmable digital devices or systems, programmable array logic devices, or any combination of the above. One or more embodiments of the invention may also be embodied in a software program for storage in a suitable storage medium and execution by a processing unit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. One or more tangible computer storage media comprising computer-executable instructions embodied thereon that when executed by a computing system having a processor and memory, cause the computing system to:
    convert data identifying a plurality of textual characters of an original document into a plurality of pixel characteristic data values; and
    form an image file with pixels having said respective pixel characteristic data values, wherein upon display, each pixel of the pixels corresponds to a unique textual character of the plurality of textual characters.

2. The media of claim 1, wherein said data comprises ASCII codes.

3. The media of claim 1, wherein said data comprises frequency-order positions of said textual characters.

4. The media of claim 1, wherein said data is determined based on a combination of a) a frequency of use of said textual characters and b) transition probabilities between successive ones of said textual characters.

5. The media of claim 1, wherein said pixel characteristic data values comprise at least one data type selected from the following: pixel intensity data values, pixel color data values, or image contrast data values.

6. The media of claim 1, wherein said pixel characteristic data values comprise pixel color data values.

7. The media of claim 6, wherein said pixel color data values comprise at least one color-data value from the following: RBG (Red, Blue, Green) pixel color data values, HSV (Hue Saturation Value) pixel color data values, or CMYK (Cyan, Magenta, Yellow, Black) color data values.

8. The method of claim 1 further comprising:
    losslessly compressing said image file.

9. The media of claim 1, wherein said data comprises differences in values of said data for successive textual characters of said plurality of textual characters.

10. The media of claim 1, wherein said textual characters are comprised of alphanumeric characters.

11. The media of claim 10 further comprising instructions that when executed by the computer system cause the computer system to locate said pixels in said image file in a same order that said alphanumeric characters are ordered within the original document.

12. The media of claim 11 further comprising instructions that when executed by the computer system cause the computer system to transmit said image file to a client.

13. The media of claim 12 further comprising instructions that when executed by the computer system cause the computer system to decode at least a region of said image file into said alphanumeric characters for viewing by said client.

14. The media of claim 13, wherein a first dimension of said decoded image file region is able to be browsed by advancing along characters within one of a plurality of alphanumeric character lines.

15. The media of claim 13, wherein a second dimension of said decoded image file region is able to be browsed by scrolling over two or more of the plurality of alphanumeric character lines.

16. The media of claim 15, wherein said browsing in said first dimension comprises advancing along a line of said alphanumeric characters, and wherein said browsing in said second dimension comprises scrolling over a plurality of lines of said alphanumeric characters.

17. The media of claim 15, wherein said browsing comprises browsing said decoded image file in a manner that emulates browsing within said original document.

18. The media of claim 10 further comprising instructions that when executed by the computer system cause the computer system to correlate locations of said pixels in said image file with locations of the alphanumeric characters corresponding to said pixels in the original document containing said alphanumeric characters.

19. The media of claim 18, wherein said pixels' locations within said image file at least substantially correspond to locations of said corresponding alphanumeric characters in said original document.

20. The media of claim 18, wherein said pixels' locations within said image file are substantially the same as locations of said corresponding alphanumeric characters in said original document.

21. The media of claim 1 further comprising instructions that when executed by the computer system cause the computer system to transmit at least a region of said image file from a server to a client.

22. The media of claim 1 further comprising instructions that when executed by the computer system cause the computer system to request a region of said image file from a server by a client.

23. The media of claim 22 further comprising instructions that when executed by the computer system cause the computer system to send said requested region of said image file by said server.

24. The media of claim 23 wherein said sending comprises transmitting compressed data suitable for decoding by said client.

25. An apparatus including a software program and a processor configured to operate under instructions of the software program, the software program causing the apparatus to perform actions, the actions comprising:
 converting, with the processor, data identifying each of a plurality of textual characters from an original document into a corresponding pixel characteristic data value of a plurality of pixel characteristic data values; and
 forming, with the processor, an image file with pixels having said respective pixel characteristic data values, wherein each pixel of the pixels corresponds to a unique textual character of the plurality of textual characters.

26. One or more tangible computer storage media comprising computer-executable instructions embodied thereon that when executed by a computing system having a processor and memory, cause the computing system to:
 convert ASCII data identifying a plurality of textual characters of an original textual document into a plurality of pixel characteristic data values, wherein ASCII data for each of the plurality of textual characters is converted to a corresponding pixel characteristic data value of the plurality of pixel characteristic data values;
 form an image file with pixels having said respective pixel characteristic data values, wherein the location within the image file of each of the pixels substantially corresponds to a location of a corresponding textual character in the original document, wherein upon display, the pixels of the image file differ from the plurality textual characters of the original document; and
 transmit at least a portion of the image file to a client, wherein the image file is decoded by a processor into the textual characters of the original textual document for viewing by the client.

* * * * *